United States Patent
Lee et al.

(10) Patent No.: US 9,546,423 B2
(45) Date of Patent: Jan. 17, 2017

(54) CLEANING OF DEPOSITION DEVICE BY INJECTING CLEANING GAS INTO DEPOSITION DEVICE

(71) Applicant: Veeco ALD Inc., Fremont, CA (US)

(72) Inventors: Sang In Lee, Los Altos Hills, CA (US); Samuel S. Pak, San Ramon, CA (US); Daniel Ho Lee, Burlingame, CA (US); Hyoseok Daniel Yang, Cupertino, CA (US)

(73) Assignee: Veeco ALD Inc., Fremont, CA (US)

(\*) Notice: Subject to any disclaimer, the term of this patent is extended or adjusted under 35 U.S.C. 154(b) by 0 days.

(21) Appl. No.: 14/645,258

(22) Filed: Mar. 11, 2015

(65) Prior Publication Data

US 2015/0259793 A1 Sep. 17, 2015

Related U.S. Application Data

(60) Provisional application No. 61/953,742, filed on Mar. 15, 2014, provisional application No. 61/953,876, filed on Mar. 16, 2014.

(51) Int. Cl.
*C23C 16/44* (2006.01)
*C23C 16/455* (2006.01)
*H01J 37/32* (2006.01)

(52) U.S. Cl.
CPC ....... *C23C 16/4405* (2013.01); *C23C 16/4412* (2013.01); *C23C 16/45544* (2013.01); *H01J 37/32091* (2013.01); *H01J 37/32357* (2013.01); *H01J 37/32834* (2013.01); *H01J 37/32853* (2013.01); *H01J 37/32862* (2013.01)

(58) Field of Classification Search
None
See application file for complete search history.

(56) References Cited

U.S. PATENT DOCUMENTS

| | | | |
|---|---|---|---|
| 5,849,088 A | * | 12/1998 | DeDontney ......... C23C 16/4401 118/719 |
| 2002/0078893 A1 | | 6/2002 | Os et al. |
| 2006/0021574 A1 | | 2/2006 | Armour et al. |
| 2006/0073276 A1 | | 4/2006 | Antonissen |
| 2008/0041308 A1 | | 2/2008 | Hong et al. |
| 2009/0178616 A1 | | 7/2009 | Byun |

OTHER PUBLICATIONS

PCT International Search Report and Written Opinion, PCT Application No. PCT/US2015/019987, Jun. 24, 2015, 15 pages.

\* cited by examiner

*Primary Examiner* — Joseph Miller, Jr.
(74) *Attorney, Agent, or Firm* — Fenwick & West LLP

(57) ABSTRACT

Embodiments relate to a deposition device that operates in two modes: a deposition mode, and a cleaning mode. In the deposition mode, modular injectors inject materials onto a substrate to form a layer. In the cleaning mode, the deposition device is cleaned without disassembly by injecting a cleaning gas. The injector module assembly may be cleaned in the cleaning mode by injecting cleaning gas through an exhaust for removing reactant precursor and routing the cleaning gas from the exhaust to another exhaust for removing source precursor. Alternatively, the injector module assembly is cleaned by injecting cleaning gas into a passage between an injector for injecting a source precursor and another injector for injecting a reactant precursor, and routing the cleaning gas to one of the exhausts in the cleaning mode.

12 Claims, 8 Drawing Sheets

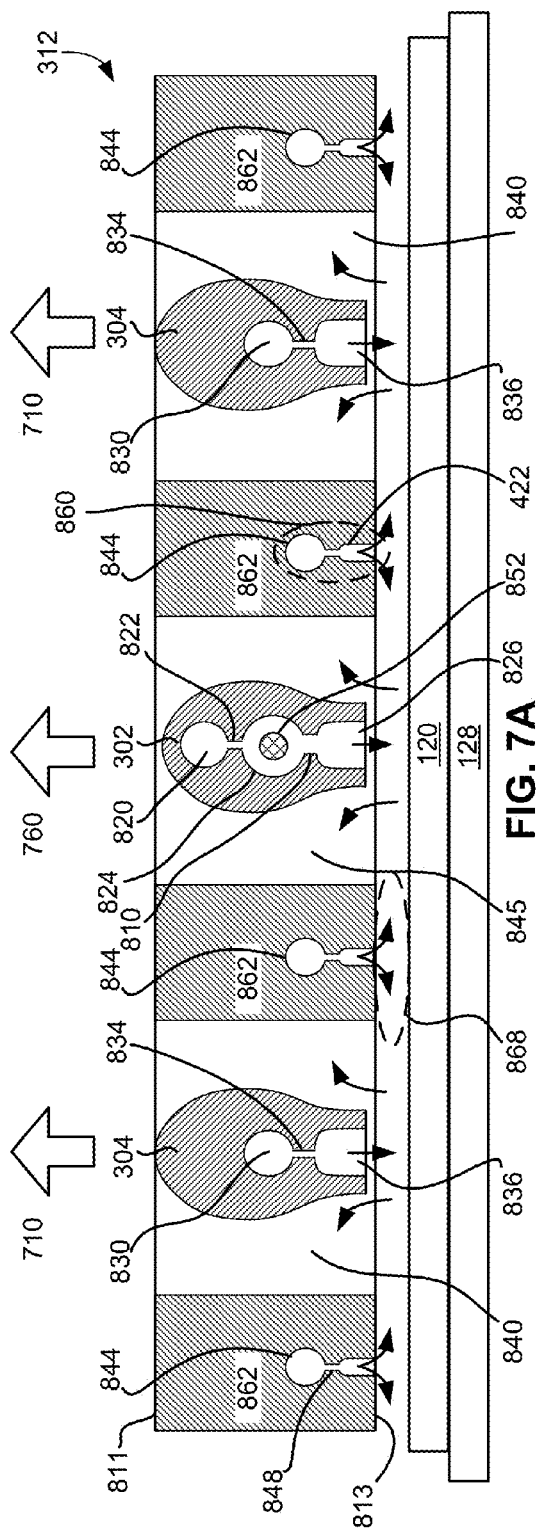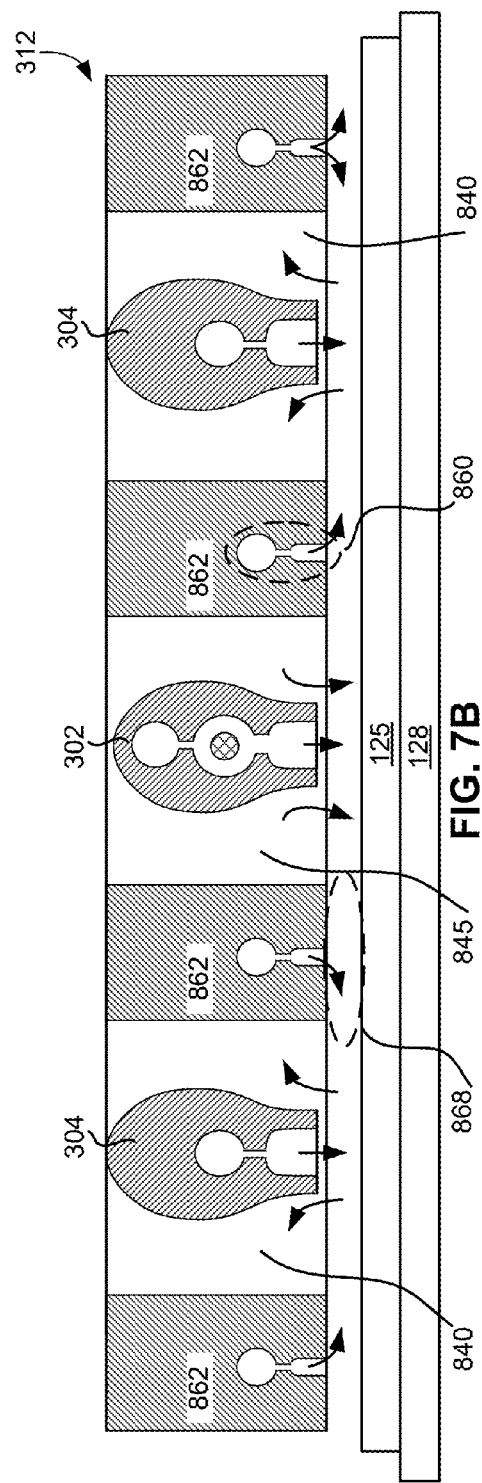

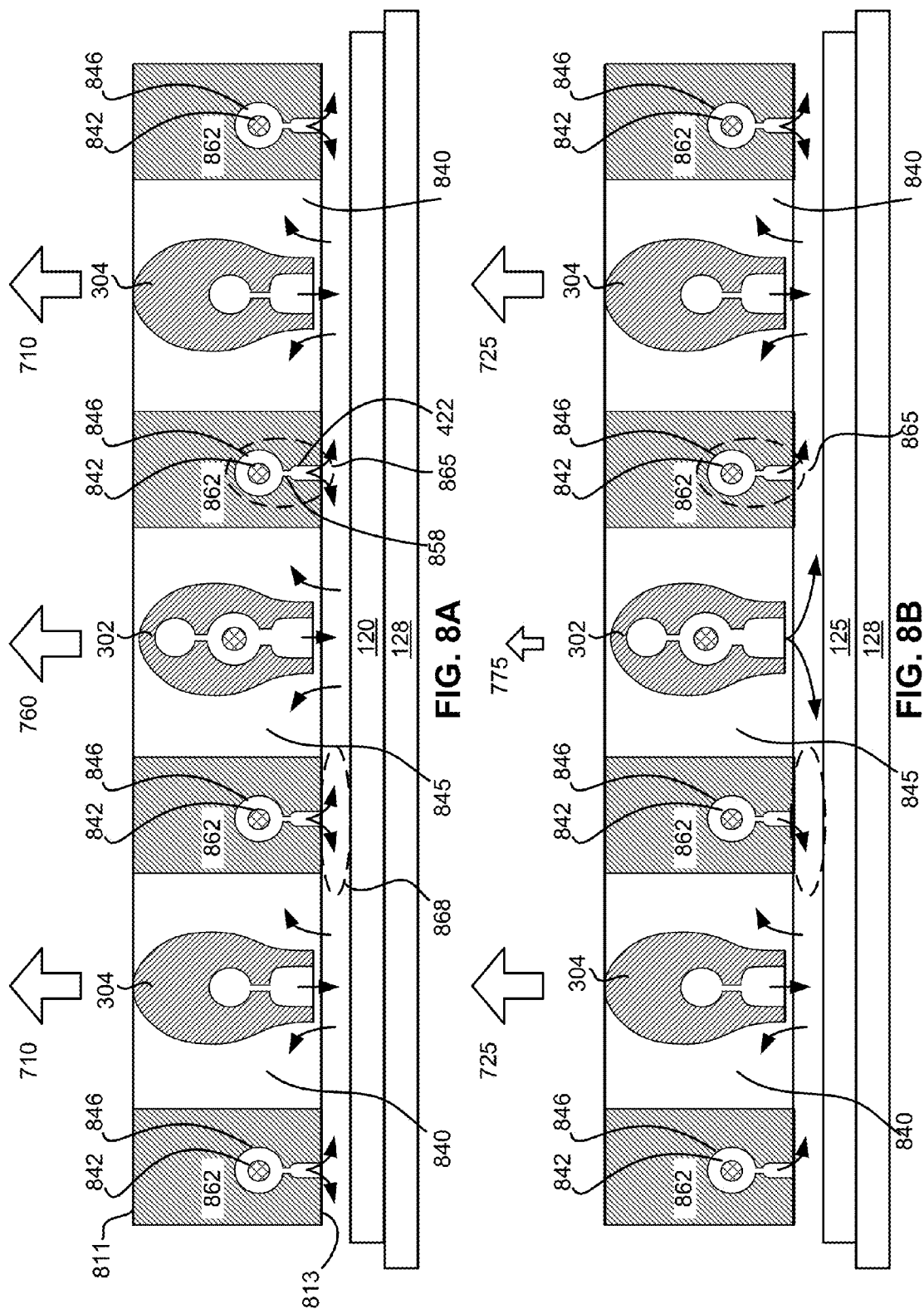

CLEANING OF DEPOSITION DEVICE BY INJECTING CLEANING GAS INTO DEPOSITION DEVICE

CROSS REFERENCE TO RELATED APPLICATIONS

This application claims the benefit of priority under 35 U.S.C. §119(e) to U.S. Provisional Application No. 61/953,742 filed on Mar. 15, 2014, and U.S. Provisional Application No. 61/953,876 filed on Mar. 16, 2014, which are incorporated by reference herein in their entirety.

BACKGROUND

1. Field of Art

The present disclosure relates to a method of cleaning a deposition device in an injection assembly for injecting materials onto a substrate to deposit a layer of material on the substrate.

2. Description of the Related Art

A deposition such as an atomic layer deposition (ALD) or a chemical vapor deposition (CVD) is a process for depositing one or more layers of material on a substrate. Depositing one or more layers involve injecting different types of chemicals on the substrate using a deposition device. ALD involves injecting two types of chemicals: a source precursor and a reactant precursor. After sequentially applying the chemicals, a layer is formed on the substrate.

During or after the deposition process, the deposition device is exposed to chemicals, and a parasitic layer can be deposited on the deposition device. The thickness of the parasitic layer on the deposition device increases as deposition processes are repeated. As a result, injectors of the deposition device for injecting chemicals or the exhausts of the deposition device for discharging chemicals become congested, and the efficiency of the deposition decreases. Additionally, as the parasitic layer on the deposition device becomes thicker, stress of the parasitic layer increases, causing the parasitic layer to be peeled off or particles to be scraped off onto the substrate, thereby degrading the quality of the layer deposited on the substrate.

SUMMARY

Embodiments relate to cleaning an injector module assembly without disassembling the injector module assembly. First gas for depositing a first material is injected onto a substrate via a first reaction chamber of the injector module assembly in a deposition mode. The first gas remaining after injecting the first gas onto the substrate is discharged through a first exhaust in the deposition mode. Second gas for removing a second material deposited on the injector module assembly is injected through the first exhaust of the injector module assembly in a cleaning mode. The second gas is routed from the first exhaust to a second exhaust of the injector module assembly in the cleaning mode to remove the second material deposited on a portion of the injector module assembly between the first exhaust and the second exhaust.

In one or more embodiments, the second gas is discharged through the second exhaust in the cleaning mode. The second material deposited in the second exhaust is removed by the second gas.

In one or more embodiments, the second gas is routed from the first exhaust to the second exhaust through a passage in the deposition mode. In the deposition mode, separation gas is injected into the passage by a separation gas injector to prevent the first gas from entering the second exhaust. In the cleaning mode, the separation gas is injected into the passage by the separation gas injector to prevent the second gas from entering the separation gas.

In one or more embodiments, third gas is injected by a second injection chamber in the deposition mode onto the substrate to deposit the first material. Separation gas may be injected by the second injection chamber in the cleaning mode to prevent the second gas from entering the second injection chamber.

In one or more embodiments, the second gas is generated by injecting plasma radicals of inert gas and causing cleaning source gas to come in contact with the plasma radicals of the inert gas to produce dissociated species for the cleaning gas.

Embodiments also relate to operating an injector module assembly by injecting cleaning gas in a cleaning mode through a separation gas injector that is used for injecting a separation gas in a deposition mode. Source gas is injected onto a substrate by a source injector in the deposition mode. The source gas is discharged from the injector module assembly through a source exhaust in the deposition mode. Reactant gas is injected onto the substrate by a reactant injector in the deposition mode. The reactant gas is discharged from the injector module assembly through a reactant exhaust in the deposition mode. The separation gas is injected by a separation gas injector between the source injector and the reactant injector to separate the source gas and the reactant gas in the deposition mode. The cleaning gas is injected by the separation gas injector in the cleaning mode. The cleaning gas may be excited by a plasma reactor with at least one of cleaning source gases such as $NF_3$, $F_2$, $SF_6$, $ClF_3$, or $Cl_2$, embodied in the separation gas injector, which injects the separation gas without plasma in a deposition mode, and radicals, for example F* or Cl* radicals, of the cleaning gas generated by exciting the plasma reactor by the plasma reactor are injected by the separation gas injector in the cleaning mode. The cleaning gas is routed to one of the source exhaust and the reactant exhaust to remove materials deposited in the source exhaust or the reactant exhaust in the cleaning mode.

In one or more embodiments, the cleaning gas is routed to one of the source exhaust and the reactant exhaust by controlling a pressure of the source exhaust and a pressure of the reactant exhaust. The cleaning gas may include F* or Cl* radicals. The cleaning gas may be generated by generating plasma with cleaning source gases such as $NF_3$, $F_2$, $SF_6$, $ClF_3$, or $Cl_2$, in the separation gas injector. The plasma may be generated by applying electric signal across electrodes of the separation gas injector.

Embodiments also relate to an injector module assembly having a separation gas injector for injecting separation gas in a deposition mode to separate source gas and reactant gas but for injecting cleaning gas in a cleaning mode to remove materials deposited in a source exhaust or a reactant exhaust. The separation gas injector is placed between a source injector and a reactant injector. The source exhaust is formed in the injection module assembly at a location of the injector module assembly along a moving direction of the substrate relative to the source injector. The source exhaust discharges the source gas remaining after injecting the source gas onto the substrate in the deposition mode. The reactant injector injects reactant gas onto the substrate in the deposition mode. The reactant exhaust is formed in the injection module along the moving direction of the substrate relative to the reactant injector. The reactant exhaust discharges the reactant gas remaining after injecting the reactant gas onto the substrate from the injector module assembly in the deposition mode. The separation gas injector is formed with a plasma radical chamber to generate the cleaning gas.

In one or more embodiments, the plasma radical chamber comprises electrodes. The electrodes are applied with an electric signal in the cleaning mode to generate plasma for generating the cleaning gas.

In one or more embodiments, the separation gas injector is formed between the source exhaust and the reactant exhaust.

In one or more embodiments, the cleaning gas is discharged via the source exhaust or the reactant exhaust.

In one or more embodiments, the reactant injector, the source injector and the separation gas injector extend along a width of the injector module assembly.

In one or more embodiments, the plasma radical chamber forms a coaxial capacitively coupled plasma (CCP) reactor.

BRIEF DESCRIPTION OF DRAWINGS

FIG. 7A is a cross sectional view of the injector module assembly operating in a deposition mode, according to one embodiment.

FIG. 7B is a cross sectional view of the injector module assembly of FIG. 7A operating in a cleaning mode, according to one embodiment.

FIG. 8A is a cross sectional view of the injector module assembly operating in a deposition mode, according to one embodiment.

FIG. 8B is a cross sectional view of the injector module assembly of FIG. 8A operating in a cleaning mode, according to one embodiment.

DETAILED DESCRIPTION OF EMBODIMENTS

Figure 1:
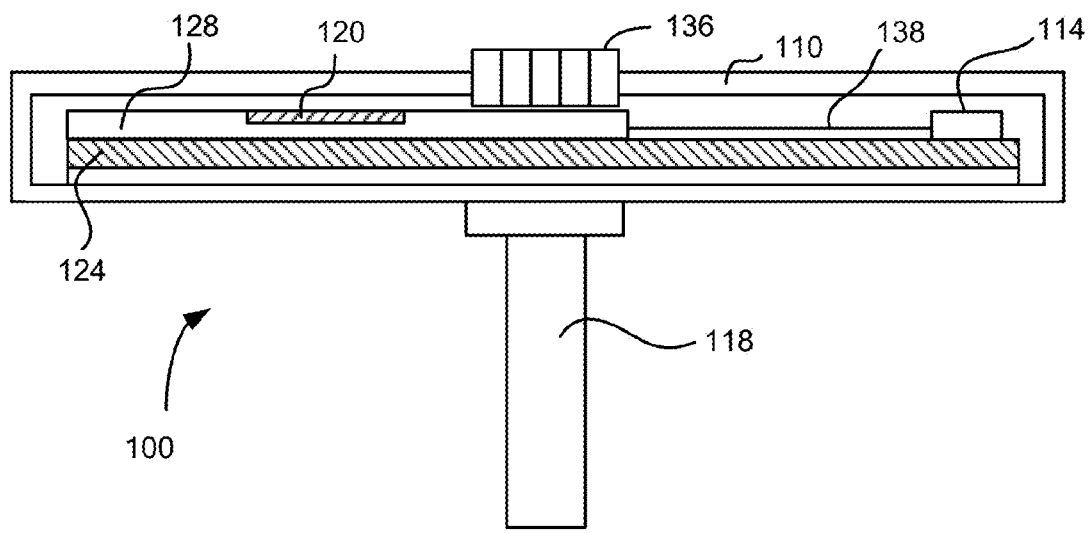
FIG. 1 is a cross sectional diagram of a linear deposition device, according to one embodiment.

Embodiments are described herein with reference to the accompanying drawings. Principles disclosed herein may, however, be embodied in many different forms and should not be construed as being limited to the embodiments set forth herein. In the description, details of well-known features and techniques may be omitted to avoid unnecessarily obscuring the features of the embodiments.

In the drawings, like reference numerals in the drawings denote like elements. The shape, size and regions, and the like, of the drawing may be exaggerated for clarity.

Embodiments relate to a deposition device that operates in two modes: a deposition mode, and a cleaning mode. In the deposition mode, modular injectors inject materials onto a substrate to deposit a layer of material on the substrate. In the cleaning mode, the deposition device is cleaned without disassembly by injecting cleaning species (herein also referred to as "cleaning gas"). The injector module assembly may be cleaned in the cleaning mode by injecting cleaning gas through an exhaust for removing reactant precursor and routing the cleaning gas from the exhaust to another exhaust for removing source precursor. Alternatively, the injector module assembly is cleaned by injecting cleaning gas into a passage between an injector for injecting a source precursor and another injector for injecting a reactant precursor, and routing the cleaning gas to one of the exhausts in the cleaning mode. By performing cleaning of the deposition device without disassembling, time for cleaning the deposition device can be reduced and deposition efficiency can be improved.

As described herein, the deposition device performs a deposition process on a substrate. The deposition process includes, among others, atomic layer deposition (ALD), chemical vapor deposition (CVD) and molecular layer deposition (MLD).

A deposition mode described herein refers to an operation mode in which the deposition device injects a layer of material on a substrate by injecting one or more types of gases.

A cleaning mode described herein refers to an operation mode in which the deposition device is cleaned by injecting cleaning gas.

Figure 2:
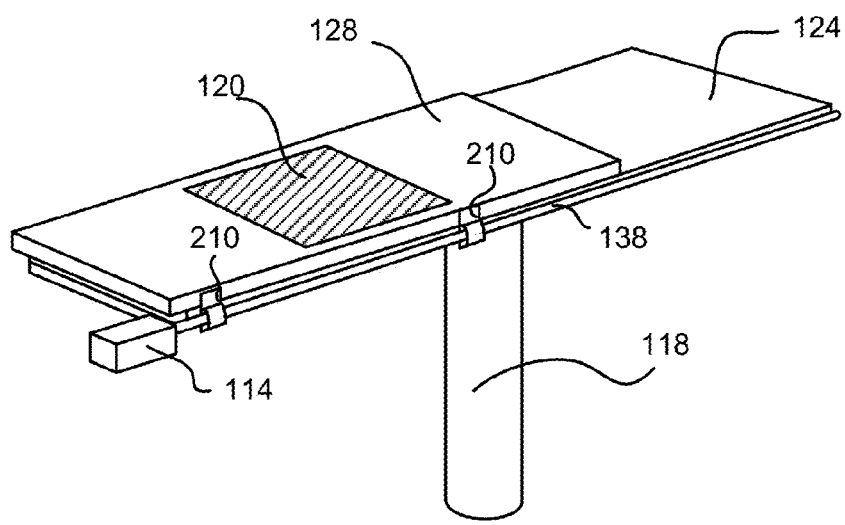
FIG. 2 is a perspective view of a linear deposition device, according to one embodiment.

FIG. 1 is a cross sectional diagram of a linear deposition device 100, according to one embodiment. FIG. 2 is a perspective view of the linear deposition device 100 (without chamber walls to facilitate explanation), according to one embodiment. The linear deposition device 100 may include, among other components, a support pillar 118, the process chamber 110 and an injector module assembly (IMA) 136. The IMA 136 may include one or more of precursor injectors or radical injectors. Each of the injectors injects source precursor (herein may be also referred to as "source gas," "precursor," or "precursor gas"), reactant precursor (herein may be also referred to as "reactant gas," "reactant," or "radicals") purge gases, or a combination of these materials onto the substrate 120. The source precursor and/or reactant precursor may be radicals of a gas mixture.

The process chamber enclosed by the walls may be maintained in a vacuum state to prevent contaminants from affecting the deposition process. The process chamber 110 contains a susceptor 128 which receives a substrate 120. The susceptor 128 is placed on a support plate 124 for a sliding movement. The support plate 124 may include a temperature controller (e.g., a heater or a cooler) to control the temperature of the substrate 120. The linear deposition device 100 may also include lift pins (not shown) that facilitate loading of the substrate 120 onto the susceptor 128 or dismounting of the substrate 120 from the susceptor 128.

In one embodiment, the susceptor 128 is secured to brackets 210 that move across an extended bar 138 with screws formed thereon. The brackets 210 have corresponding screws formed in their holes receiving the extended bar 138. The extended bar 138 is secured to a spindle of a motor 114, and hence, the extended bar 138 rotates as the spindle of the motor 114 rotates. The rotation of the extended bar 138 causes the brackets 210 (and therefore the susceptor 128) to make a linear movement on the support plate 124. By controlling the speed and rotation direction of the motor 114, the speed and the direction of the linear movement of the susceptor 128 can be controlled. The use of the motor 114 and the extended bar 138 is merely an example of a mechanism for moving the susceptor 128. Various other ways of moving the susceptor 128 (e.g., use of gears and pinion at the bottom, top or side of the susceptor 128) can be implemented. Moreover, instead of moving the susceptor 128, the susceptor 128 may remain stationary and the IMA 136 may be moved.

Figure 3:
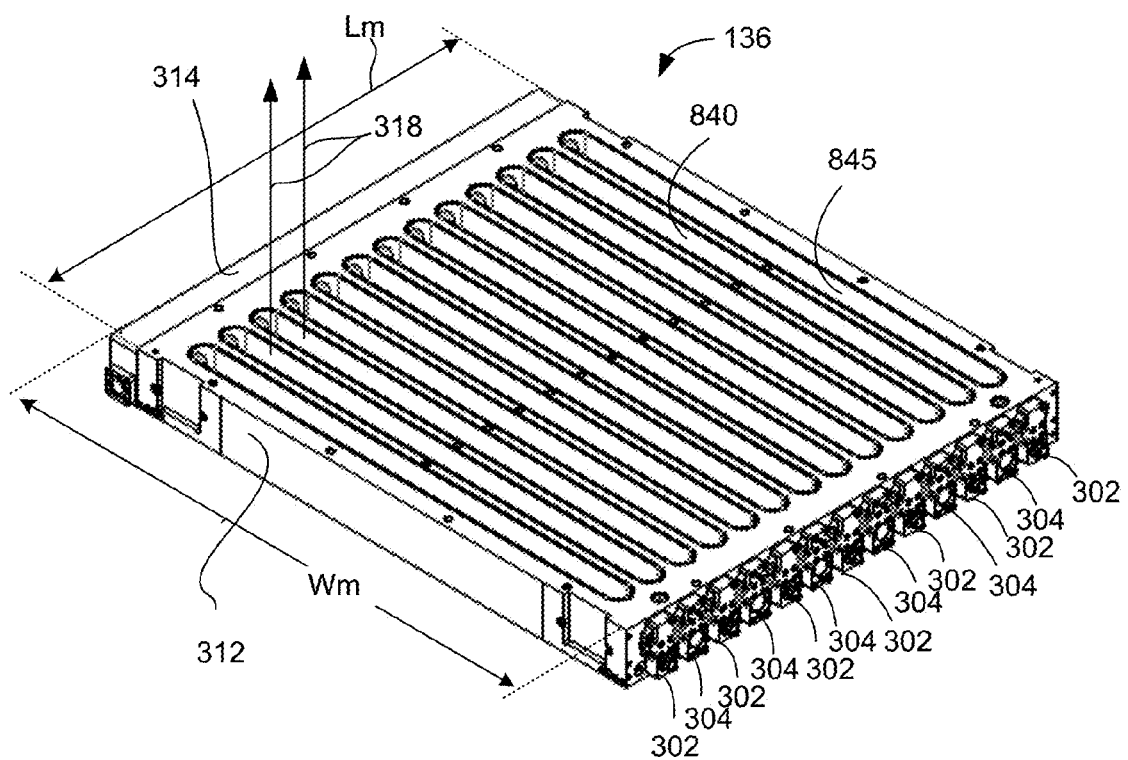
FIG. 3 is a perspective view of an injector module assembly of the linear deposition device mounted with precursor injectors and radical injectors, according to one embodiment.

FIG. 3 is a perspective view of the IMA 136 mounted with precursor injectors 304 (herein also referred to as "source injectors 304") and radical injectors 302 (herein also referred to as "reactant injectors 302" or "plasma injectors 302"), according to one embodiment. The IMA 136 includes a body 312 and an end plate 314 attached to one end of the body 312. The end plate 314 and the body 312 may be secured, for example, by screws.

The body 312 is formed with exhausts 840 and 845 for receiving precursor injectors 304 and radical injectors 302. The precursor injectors 304 and radical injectors 302 may be mounted into the exhausts 840 and 845 of the body 312 using screws, for example. The precursor injectors 304 and radical injectors 302 can be removed from the body 312 for replacement. By modularizing the IMA 136, only some of the precursor injectors 304 or the radical injectors 302 can be removed from the IMA 136 for replacement while retaining the remaining precursor injectors 304 or the radical injectors 302 and the body 312.

The IMA 136 has a width of Wm and a length of Lm. Each of the exhausts 840 and 845 extends along the width Wm of the IMA 136. Each of the exhausts 840 and 845 extends from the bottom surface of the body 312 to the top surface of the body 312. When mounted, the precursor injector 304 injects source precursor and the radical injector 302 injects reactant precursor through respective injection port at the bottom. A source exhaust 840 (herein also referred to as "a precursor exhaust 840") discharges excess source precursor and a reactant exhaust 845 (herein also referred to as "a radical exhaust 845," "a plasma exhaust 845," or "a plasma radical exhaust 845") discharges excess reactant precursor through the top as shown by arrows 318 in a deposition mode.

As shown, the precursor injectors 304 and radical injectors 302 are mounted onto the body 312. In the example of FIG. 3, the precursor injectors 304 and radical injectors 302 are arranged in an alternating manner. However, the precursor injectors 304 and radical injectors 302 may be arranged in a different manner. Moreover, only the precursor injectors 304 or radical injectors 302 may be mounted onto the body 312. By passing the substrate 120 below the IMA 136, either with a rotational motion or linear motion, an area of the substrate 120 is sequentially exposed to different radicals and precursor to deposit material using an atomic layer deposition (ALD) process or other deposition processes.

Figure 4:
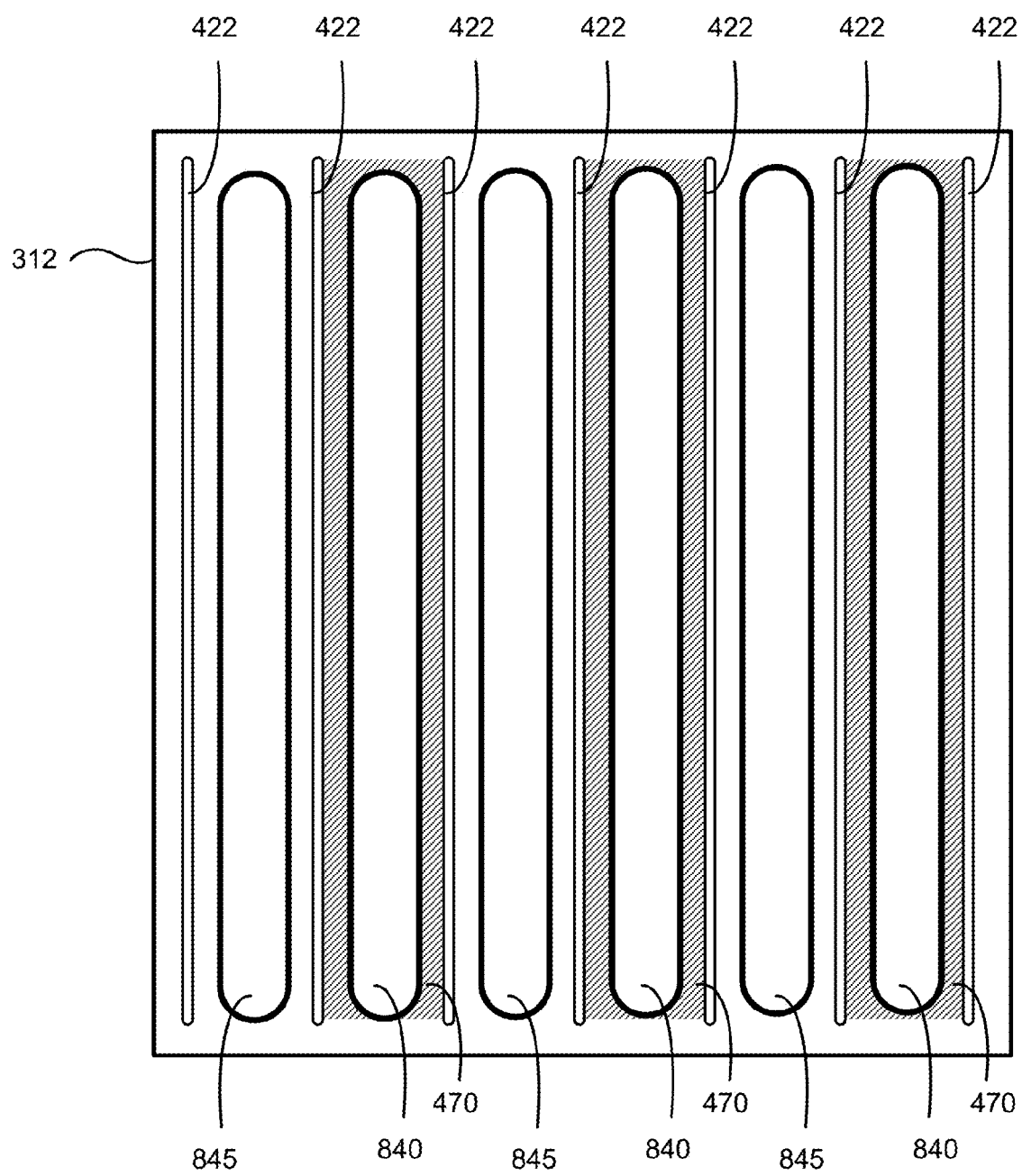
FIG. 4 is a bottom view of the injector module assembly of FIG. 3, according to one embodiment.

FIG. 4 is a bottom view of the injector module assembly of FIG. 3, according to one embodiment. The precursor injectors 304 are exposed through source exhaust 840 to inject source precursor onto the substrate 120. The radical injectors 302 are exposed through reactant exhaust 845 to inject the reactant precursor onto the substrate 120. By shifting the IMA 136 or the substrate 120, the source precursor and the reactant precursor can be sequentially injected onto an area of the substrate 120 to deposit a layer.

The body 312 is also formed with slits 422 to inject, for example, purge gas or inert gas (e.g., Argon) onto the substrate 120. The slits 422 are formed at the leading end of the body 312, the trailing end of the body 312 and between the source exhausts 840 and the reactant exhausts 845. The slits 422 forms a part of a separation gas injector that injects inert gas (herein also referred to as "separation gas") to prevent the source precursor from entering the reactant exhaust 845 and the reactant precursor from entering the source exhaust 840 in the deposition mode. Hence, forming a layer in the source exhaust 840 or the reactant exhaust 845 may be prevented.

However, when the IMA 136 or the substrate 120 is shifted, excess reactant precursor may breach into the source exhaust 840 or source precursor may breach into the reactant exhaust 845, and form a parasitic layer 470 (e.g., $TiO_2$, $SiO_2$) on the IMA 136. Generally, the reactant precursor generated by plasma is lighter than source precursor, and likely to be discharged through the radical exhaust 845. Source precursor on the other hand may be heavier than the reactant precursor, and thus, the source precursor remaining in the source exhaust 840 can react with the reactant precursor to form the parasitic layer 470 in the source exhaust 840.

Figure 5:
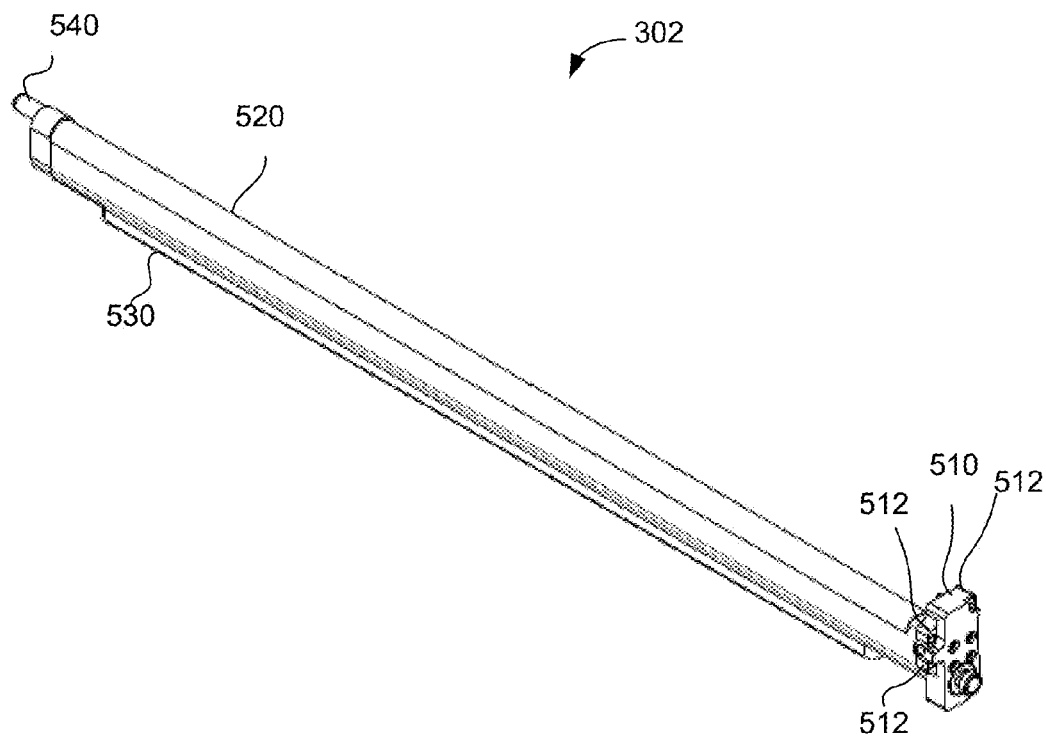
FIG. 5 is a perspective view of a radical injector, according to one embodiment.

FIG. 5 is a perspective view of the radical injector 302, according to one embodiment. The radical injector 302 generates radicals using gas or mixture by generating plasma in a chamber formed in the radical injector 302. The radical injector 302 may include, among other parts, an elongated body 520, a protruding leg 540 at one end of the elongated body 520, and an end block 510 at the other end of the elongated body 520. The elongated body 520 includes injection port 530 and is formed with a gas channel 820, reaction chamber 826, and radical chamber 824 (herein also referred to as "a plasma chamber 824" or "a plasma radical chamber 824"), as described below in detail with reference to FIG. 7A.

The protruding leg 540 extends along the length of the radical injector 302. When assembling, the protruding leg 540 is inserted into a support hole formed in the end plate 314. The protruding leg 540 is, for example, cylindrical in shape.

The end block 510 is used for securing the radical injector 302 to the body 312. For this purpose, the end block 510 includes screw holes 512 for receiving screws. A power line is also connected to the end block 510 to provide electric signal for generating plasma within the elongated body 520. Also, the gas or mixture for generating the radicals is injected into the radical injector 302 via the end block 510.

Figure 6:
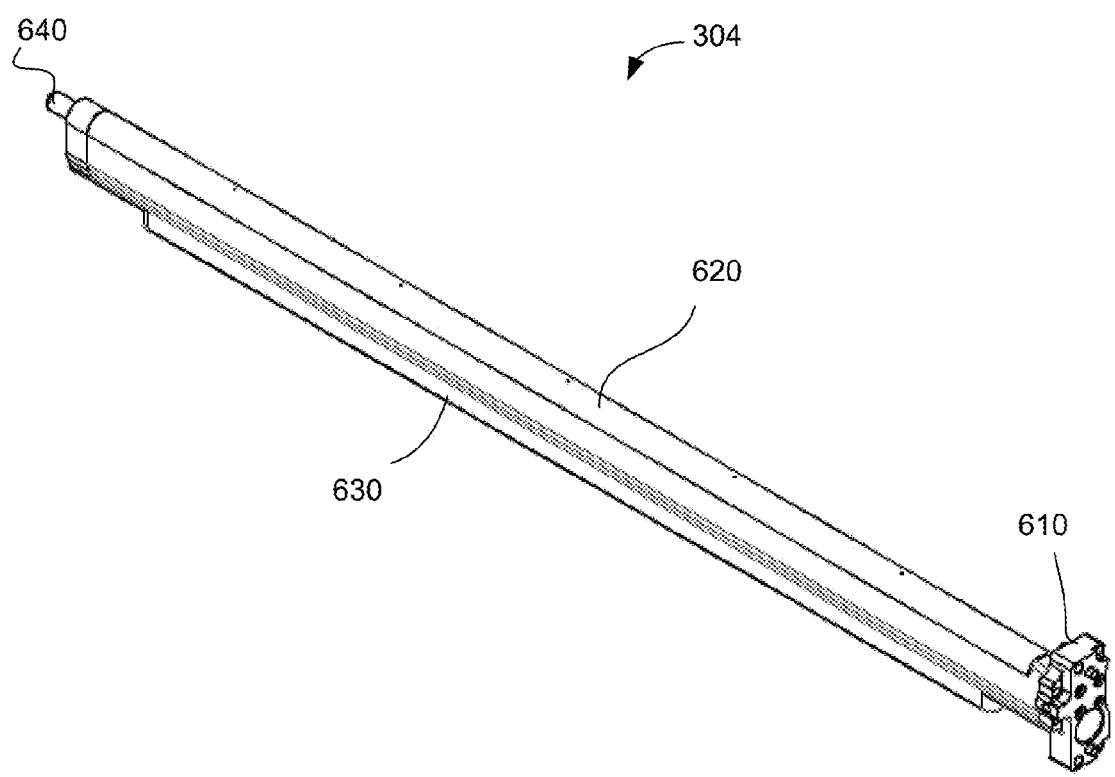
FIG. 6 is a perspective view of a source injector, according to one embodiment.

FIG. 6 is a perspective view of a precursor injector 304, according to one embodiment. The precursor injector 304 is different from the radical injector 302 in that the precursor injector 304 does not generate radicals but merely injects gas or mixture through the injection port 630 onto the substrate 120. Similar to the radical injector 302, the precursor injector 304 includes a protruding leg 640, an elongated body 620, and an end block 610. The elongated body 620 includes an injection port 630. The elongated body 620 is formed with gas channel 830 and reaction chamber 836, as described below in detail with reference to FIG. 7A. A parasitic layer is likely to be deposited on the elongated body 620 of the precursor injector 304 rather than the elongated body 520 of the radical injector 302, and therefore, the precursor injector 304 may need to be cleaned more frequently.

The structure and the function of the protruding leg 640 and the end block 610 are substantially the same as the protruding leg 540 and the end block 510 except that the end block 610 is not connected to a power line, and therefore, the detailed description of the protruding leg 640 and the end block 610 is omitted herein for the sake of brevity.

FIG. 7A is a cross sectional view of the IMA 136 mounted with the precursor injector 304 and the radical injector 302 operating in a deposition mode, according to one embodiment. The body 312 includes walls 862 that extend from the bottom surface 813 to the top surface 811. The source exhausts 840 and the reactant exhausts 845 are formed between the walls 862 to accommodate the radical injectors 302 and the precursor injectors 304.

The radical injector 302 is formed with a gas channel 820 that extends along the length of the elongated body 520. Gas is injected into a radical chamber 824 from the gas channel 820 via gas holes 822. The radical chamber 824 may be coaxial capacitively coupled plasma (CCP) reactor. Within the radical chamber 824, radicals are formed by generating plasma between an electrode 852 and the interior surface of the radical chamber 824. The generated radicals are transferred via a slit 810, for example having a width of 1 mm to 5 mm, a reaction chamber 826 where the radicals are injected onto the substrate 120 on the susceptor 128.

The precursor injector 304 is formed with a gas channel 830 that extends along the length of the elongated body 620. The precursor gas is injected into a reaction chamber 836 formed in the elongated body 620 from the gas channel 830 via gas holes 834.

Separation gas injector 860 is formed within the walls 862 of the body 312. The separation gas injector 860 includes a gas channel 844 and a slit 422. In the deposition mode, the cleaning gas (or purge gas) is provided to the slit 422 via the gas channel 844 and the gas holes 848 between the slit 422 and the gas channel 844. The separation gas is injected to a passage 868 under a bottom of the wall 862 between the source exhaust 840 and the reactant exhaust 845.

The excess radicals (or gas reverted to inert state) and part of the purge gas injected by the slit 422 are discharged via the reactant exhaust 845 formed between the walls 862 surrounding the source injector 304 in the deposition mode. Similarly, excess precursor and part of the purge gas are discharged via the source exhaust 840 formed between the walls 862 surrounding the radical injector 302 in the deposition mode.

In one embodiment, excess radicals, purge gas and the precursor are discharged out of the IMA 136. In this configuration, excess source precursor is discharged through the source exhaust 840, excess reactant precursor is discharged through the reactant exhaust 845, and separation gas is discharged through both adjacent source exhaust 840 and reactant exhaust 845 in the deposition mode.

FIG. 7B is a cross sectional view of the IMA 136 mounted with the precursor injector 304 and the radical injector 302 operating in a cleaning mode, according to one embodiment. The structure of IMA 136 of FIG. 7B is similar to the IMA 136 of FIG. 7A, therefore the detailed thereof is omitted for the sake of brevity. In the cleaning mode, the substrate 120 may be removed, or the substrate 120 may be replaced with a substrate 125 used for the cleaning purpose. Different materials are injected, and different pressures are applied to the exhausts in the cleaning mode than in the deposition mode.

In one embodiment, a remote plasma source is coupled to the reactant exhaust 845 and injects cleaning gas through the reactant exhaust 845 in the cleaning mode. For example, ASTRON®i AX7670 (available from MKS Instruments of Andover, Mass., USA) is used as a remote plasma source. The cleaning gas, for example, dissociated fluorine species such as F* from $NF_3$, is routed to the source exhaust 840 via the passages 868 and is discharged from the IMA 136. While being routed from the reactant exhaust 845 to the source exhaust 840, the cleaning gas removes unwanted deposits, such as the parasitic layer 470 from the IMA. The cleaning gas routed to the source exhaust 840 reacts with the parasitic layer 470 along its path and removes the parasitic layer 470 from the IMA 136.

In another embodiment, the remote plasma source injects cleaning gas to the source exhaust 840, and discharges the cleaning gas along with materials to be removed through adjacent reactant exhausts 845 in the cleaning mode. For example, the remote plasma source applies an outward pressure to the source exhaust 840, and an inward pressure to the reactant exhaust 845 in the cleaning mode. In this configuration, the cleaning gas is routed from the source exhaust 840 to adjacent reactant exhausts 845 through the passages 868.

The cleaning gas generated by the remote plasma source may contain F* or Cl* radicals. The cleaning gas can be generated by producing plasma using a microwave device or an inductively coupled plasma device, and exposing the plasma to mixed gas containing fluorine containing gas (e.g., $NF_3$, $F_2$, or $SF_6$) or chlorine containing gas (e.g., $ClF_3$, or $Cl_2$). For example, the mixed gas may include 10 to 60% of $NF_3$ and 40 to 90% of Ar.

The reactant injector 302 may generate Argon plasma in the reactant exhaust 845 to improve cleaning efficiency in the cleaning mode. The reactant injector 302 injects Argon plasma to the reactant exhaust 845, and Argon plasma contacts radicals (F* or Cl*) of the cleaning gas. Through Penning ionization, additional plasma can be generated or radicals can be reproduced near the reaction chamber 826 of the radical injector 302. Additional plasma generated can produce additional radicals or radicals reproduced near the reaction chamber 826 are routed to the source exhaust 840 and react with parasitic layer on the IMA 136. Thus, the cleaning efficiency can be improved.

The source injector 304 injects separation gas (e.g., Ar) to prevent the cleaning gas from entering the source injector 304 in the cleaning mode. Similarly, the separation gas injector 860 injects separation gas to prevent the cleaning gas from entering the separation gas injector 860 in the cleaning mode.

FIG. 8A is a cross sectional view of the injector module assembly operating in a deposition mode, according to one embodiment. The structure of IMA 136 of FIG. 8A is similar to the IMA 136 of FIG. 7A except that the separation gas injector 865 of FIG. 8A includes an electrode 842 and a radical chamber 846 (herein also referred to as "a plasma chamber 846" or "a plasma radical chamber 846") to generate plasma in the cleaning mode, and therefore, the detailed description thereof is omitted for the sake of brevity. In the deposition mode, the separation gas injector 865 injects separation gas (e.g., Ar) into the passage 868 without generating plasma. Hence, the operation of the IMA 136 of 8A in the deposition mode is the same as the operation of the IMA 136 described above with reference to FIG. 7A, and therefore, detailed description of the operation of the IMA 136 of FIG. 8A is omitted herein for the sake of brevity.

FIG. 8B is a cross sectional view of the injector module assembly 136 of FIG. 8A operating in a cleaning mode, according to one embodiment. The structure of IMA 136 of FIG. 8B is the same as the structure of the IMA 136 of FIG. 8A, and therefore, the detailed thereof is omitted for the sake of brevity.

In the cleaning mode, the separation gas injector 865 generates the cleaning gas in a radical chamber 846. The cleaning source gas may include fluorine containing gas (e.g., $NF_3$, $F_2$, or $SF_6$) or chlorine containing gas (e.g., $ClF_3$, $Cl_2$). Within the radical chamber 846, cleaning gases including for example F* or Cl* radicals, are produced by generating plasma between an electrode 842 and the interior surface of the radical chamber 846. The generated radicals as cleaning gases, are transferred to a slit 422 through channel 858 where the radicals are injected into the passage 868.

In one embodiment, excess radicals, purge gas and the precursor are discharged using a vacuum source (not shown) coupled to the IMA 136. The vacuum source can be connected to the top of the source exhaust 840 and the reactant exhaust 845. The vacuum source discharges the cleaning gas along with materials to be removed through source exhausts 840 in the cleaning mode. In one embodiment, the vacuum source applies an outward pressure 725 to the source exhaust 840, and an outward pressure 775 to the reactant exhaust 845 in the cleaning mode. In one embodiment, the outward pressure 775 applied to the reactant exhaust 845 is less than the outward pressure 725 applied to the source exhaust 840. The outward pressure 775 may be reduced by partially closing the reactant exhaust 845, or controlling the vacuum source to apply less pressure to the reactant exhaust 845. In this configuration, the cleaning gas is routed from the separation gas injector 865 to an adjacent source exhaust 840 through the passage 868. The cleaning gas routed to the source exhaust 840 reacts with the parasitic layer deposited in the source exhaust 840, and chemicals combined with the cleaning gas and materials of the parasitic layer can be removed through the source exhaust 840 out of the IMA 136.

In other embodiments, the vacuum source discharges the cleaning gas along with materials to be removed through reactant exhausts 845 in the cleaning mode. The outward pressure 775 applied to the reactant exhaust 845 is higher than the outward pressure 725 applied to the source exhaust 840. In this case, the outward pressure 725 may be reduced by partially closing the source exhaust 840 or controlling the vacuum source to apply less pressure to the source exhaust 840. In this configuration, the cleaning gas is routed from the separation gas injector 865 to an adjacent reactant exhaust 845 through the passage 868.

The reactant injector 302 injects separation gas (e.g., Ar) to prevent the cleaning gas from entering the reactant injector 302 in the cleaning mode. Part of the separation gas injected from the reactant injector 302 is routed to adjacent source exhausts 840 through passages 868, and part of the separation gas is discharged out of the IMA 136 through the reactant exhaust 845. By injecting the separation gas (e.g., Ar) by the reactant injector 302 in the cleaning mode, the cleaning gas does not enter the reactant injector 302. Therefore, damage or changes in the properties of the radical chamber 824 or the electrode 852 due to their contact with the cleaning gas can be prevented.

The source injector 304 injects separation gas (e.g., Ar) to prevent the cleaning gas from entering the source injector 304 in the cleaning mode. The separation gas injected by the source injector 304 and additional separation gas injected by the reactant injector 302 are discharged out of the IMA 136 through the source exhaust 840 and the reactant exhaust 845.

Advantageously, IMA 136 disclosed in FIGS. 7A through 8B can be cleaned in its assembled form without disassembly. Therefore, time for cleaning the IMA 136 can be reduced, which in turn increases the amount of time that the IMA 136 can be used for the deposition process.

Figure 9A:
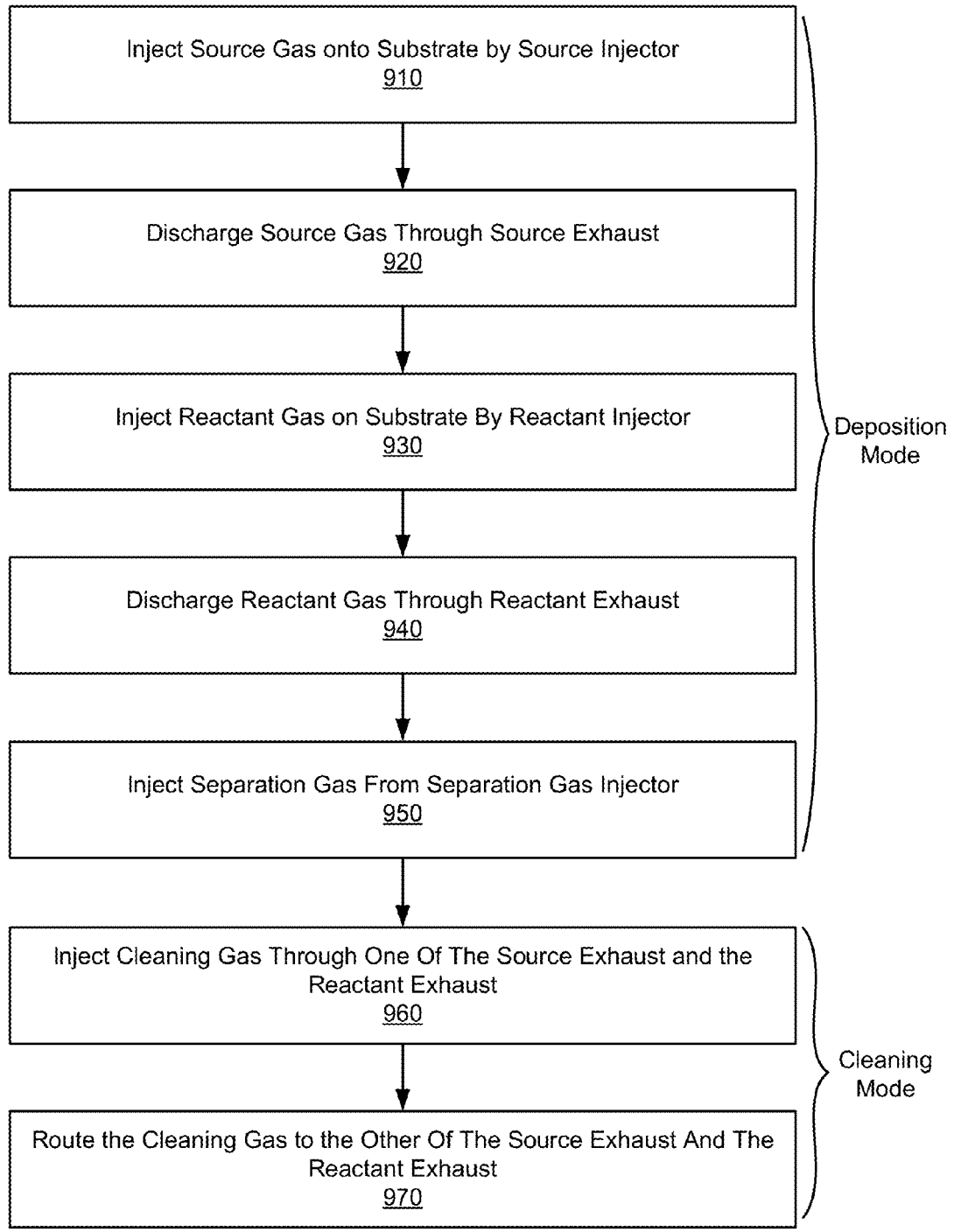
FIG. 9A is a flowchart illustrating a process of depositing a layer using an injector module assembly and cleaning the injector module assembly after depositing the layer, according to one embodiment.

FIG. 9A is a flowchart illustrating a process of depositing a layer using the IMA 136 of FIGS. 7A and 7B, and cleaning the IMA 136 after depositing the layer, according to one embodiment. Source gas is injected 910 onto a substrate by a source injector in a deposition mode. The source gas remaining after injecting the source gas onto the substrate is discharged 920 through a source exhaust in the deposition mode.

A portion of the substrate exposed to the source gas may be then moved below a reactant injector. Below the reactant injector, the portion of the substrate is injected 930 with the reactant gas. The reactant gas remaining after injecting the reactant gas onto the substrate is discharged 940 through a reactant exhaust in the deposition mode.

In the deposition mode, separation gas is injected 950 by a separation gas injector to separate the source gas in the source exhaust and the reactant gas in the reactant exhaust from mixing together.

In the cleaning mode, cleaning gas is injected 960 through one of the source exhaust and the reactant exhaust. The cleaning gas can be injected by, for example, a remote plasma source. The cleaning gas is routed 970 to the other of the source exhaust and the reactant exhaust. The cleaning gas reacts with parasitic layer deposited in the other of the source exhaust and the reactant exhaust, and chemicals combined with the cleaning gas and materials the parasitic layer are discharged from the IMA 136.

Figure 9B:
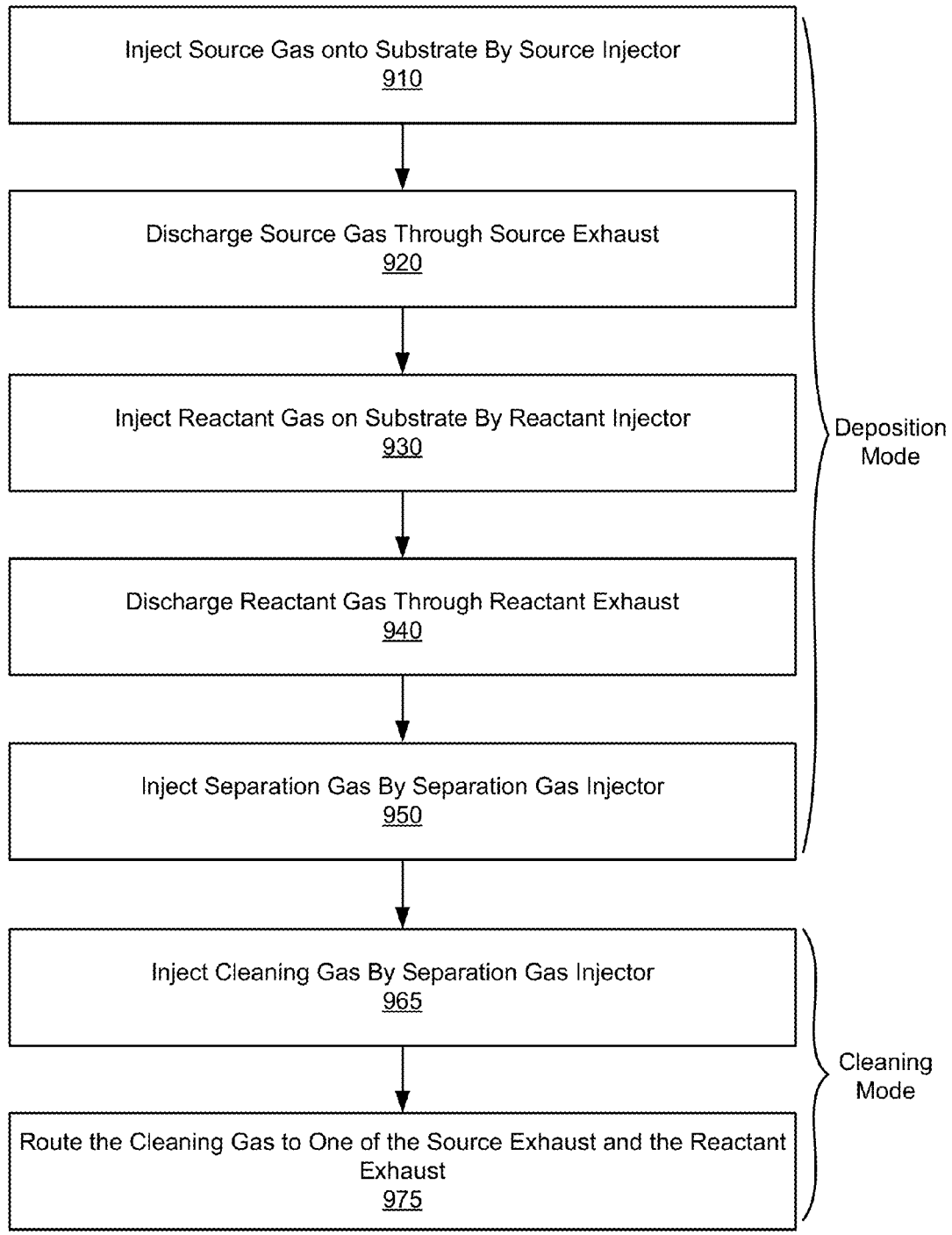
FIG. 9B is a flowchart illustrating a process of depositing a layer using an injector module assembly and cleaning the injector module assembly after depositing the layer, according to another embodiment.

FIG. 9B is a flowchart illustrating a process of depositing a layer using the IMA 136 of FIGS. 8A and 8B, and cleaning the IMA 136 after depositing the layer, according to one embodiment. Source gas is injected 910 onto a substrate by a source injector in a deposition mode. The source gas remaining after injecting the source gas onto the substrate is discharged 920 through a source exhaust in the deposition mode.

A portion of the substrate exposed to the source gas may be then moved below a reactant injector. Below the reactant injector, the portion of the substrate is injected 930 with the reactant gas. The reactant gas remaining after injecting the reactant gas onto the substrate is discharged 940 through a reactant exhaust in the deposition mode.

Separation gas is injected 950 by a separation gas injector to separate the source gas in the source exhaust and the reactant gas in the reactant exhaust from mixing together in the deposition mode.

In the cleaning mode, cleaning gas is injected 965 by the separation gas injector. The cleaning gas is routed 975 to one of the source exhaust and the reactant exhaust. The cleaning gas can be routed to the one of the source exhaust and the reactant exhaust by controlling pressure of the source exhaust and the reactant exhaust. The cleaning gas reacts with the parasitic layer in the one of the source exhaust and the reactant exhaust, and chemicals combined with the cleaning gas and materials of the parasitic layer are discharged from the IMA 136.

Although a cleaning operation is described with respect to a deposition device for depositing a layer through ALD, the principles disclosed can apply to the cleaning operation or methods for depositions devices used for other deposition processes such as chemical vapor deposition (CVD) and molecular layer deposition (MLD).

While particular embodiments and applications have been illustrated and described, the disclosed embodiments are not limited to the precise construction and components disclosed herein. Various modifications, changes and variations, may be made in the arrangement, operation and details of the method and apparatus disclosed herein.

What is claimed is:

1. A method of operating an injector module assembly, comprising:
   injecting first gas for depositing a first material onto a substrate by a first reaction chamber in a deposition mode;
   discharging, away from the substrate, the first gas remaining after injecting the first gas onto the substrate through a first exhaust in the deposition mode;
   injecting separation gas into a passage by a separation gas injector to prevent the first gas from entering a second exhaust in the deposition mode;
   injecting second gas for removing a second material deposited on the injector module assembly through the first exhaust of the injector module assembly in a cleaning mode;
   injecting the separation gas into the passage by the separation gas injector to prevent the second gas from entering the separation gas injector in the cleaning mode; and
   routing the second gas from the first exhaust to the second exhaust of the injector module assembly in the cleaning mode through the passage to remove the second material deposited on a portion of the injector module assembly between the first exhaust and the second exhaust.

2. The method of claim 1, further comprising discharging, away from another substrate, the second gas through the second exhaust in the cleaning mode, wherein the second material deposited in the second exhaust is removed by the second gas.

3. The method of claim 1, further comprising:
   injecting third gas by a second injection chamber in the deposition mode onto the substrate to deposit the first material; and
   injecting the separation gas by the second injection chamber in the cleaning mode to prevent the second gas from entering the second injection chamber.

4. A method of operating an injector module assembly, comprising:
   injecting first gas for depositing a first material onto a substrate by a first reaction chamber in a deposition mode;
   discharging, away from the substrate, the first gas remaining after injecting the first gas onto the substrate through a first exhaust in the deposition mode;
   injecting second gas for removing a second material deposited on the injector module assembly through the first exhaust of the injector module assembly in a cleaning mode; and
   routing the second gas from the first exhaust to a second exhaust of the injector module assembly in the cleaning mode to remove the second material deposited on a portion of the injector module assembly between the first exhaust and the second exhaust,
   wherein the second gas is generated by injecting plasma radicals of inert gas and causing cleaning source gas to come in contact with the plasma radicals of the inert gas to produce dissociated species for the second gas.

5. The method of claim 4, wherein the cleaning source gas includes at least one of $NF_3$, $F_2$, and $SF_6$, or at least one of $ClF_3$, and $Cl_2$.

6. A method of operating an injector module assembly, comprising:
   injecting source gas onto a substrate by a source injector in a deposition mode;
   discharging the source gas from the injector module assembly through a source exhaust in the deposition mode;
   injecting reactant gas onto the substrate by a reactant injector in the deposition mode;
   discharging the reactant gas from the injector module assembly through a reactant exhaust in the deposition mode;
   injecting separation gas by a separation gas injector between the source injector and the reactant injector to separate the source gas and the reactant gas in the deposition mode;
   injecting cleaning gas by the separation gas injector in a cleaning mode; and
   routing the cleaning gas to one of the source exhaust and the reactant exhaust to remove materials deposited in the source exhaust or the reactant exhaust in the cleaning mode.

7. The method of claim 6, wherein the cleaning gas is routed to one of the source exhaust and the reactant exhaust by controlling a pressure of the source exhaust and a pressure of the reactant exhaust.

8. The method of claim 6, wherein the cleaning gas is generated by generating plasma in the separation gas injector with cleaning source gas.

9. The method of claim 8, wherein the cleaning source gas includes at least one of $NF_3$, $F_2$, and $SF_6$, or at least one of $ClF_3$, and $Cl_2$.

10. The method of claim 8, wherein the plasma is generated by applying electric signal across electrodes of the separation gas injector.

11. The method of claim 4, further comprising discharging, away from another substrate, the second gas through the second exhaust in the cleaning mode, wherein the second material deposited in the second exhaust is removed by the second gas.

12. The method of claim 4, further comprising:
   injecting third gas by a second injection chamber in the deposition mode onto the substrate to deposit the first material; and
   injecting separation gas by the second injection chamber in the cleaning mode to prevent the second gas from entering the second injection chamber.

* * * * *